United States Patent
Lassar et al.

(10) Patent No.: US 6,736,488 B1
(45) Date of Patent: May 18, 2004

(54) ELECTRICAL INTERCONNECT FOR PRINTHEAD ASSEMBLY

(75) Inventors: Noah Carl Lassar, San Diego, CA (US); Luis Hierro, Barcelona (ES); Joseph Edward Scheffelin, Poway, CA (US); Ernesto A. Garay, Gresham, OR (US); Kenneth R. Williams, Vancouver, WA (US); Shayler M. Backlund, Vancouver, WA (US); Tanya Schneider, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/444,434

(22) Filed: May 23, 2003

(51) Int. Cl.$^7$ ................................ B41J 2/14; B41J 2/16
(52) U.S. Cl. .............................. 347/50; 347/49
(58) Field of Search ................ 347/50, 49, 58

(56) References Cited

U.S. PATENT DOCUMENTS

| | | |
|---|---|---|
| 4,806,106 A | 2/1989 | Mebane et al. |
| 4,907,018 A | 3/1990 | Pinkerpell et al. |
| 5,016,023 A | 5/1991 | Chan et al. |
| 5,079,189 A | 1/1992 | Drake et al. |
| 5,160,945 A | 11/1992 | Drake |
| 5,442,386 A | 8/1995 | Childers et al. |
| 5,461,482 A | 10/1995 | Wilson et al. |
| 5,469,199 A | 11/1995 | Allen et al. |
| 5,541,629 A | 7/1996 | Saunders et al. |
| 5,598,194 A | 1/1997 | Hall et al. |
| 5,610,642 A | 3/1997 | Nobel et al. |
| 5,696,544 A | 12/1997 | Komuro |
| 5,719,605 A | 2/1998 | Anderson et al. |
| 5,742,305 A | 4/1998 | Hackleman |
| 5,755,024 A | 5/1998 | Drake et al. |
| 5,796,417 A | 8/1998 | Nobel |
| 5,835,111 A | 11/1998 | Balazer |
| 5,946,012 A | 8/1999 | Courian et al. |
| 5,953,028 A | 9/1999 | Nobel et al. |
| 6,322,200 B1 | 11/2001 | Feinn et al. |
| 6,325,491 B1 | 12/2001 | Feinn |
| 6,350,013 B1 | 2/2002 | Scheffelin et al. |
| 6,394,580 B1 | 5/2002 | Scheffelin et al. |
| 6,428,145 B1 | 8/2002 | Feinn et al. |
| 6,565,198 B2 * | 5/2003 | Saruta et al. .................. 347/86 |

FOREIGN PATENT DOCUMENTS

EP          1164025 A1 * 12/2001 ............ B41J/2/175

* cited by examiner

Primary Examiner—Thinh Nguyen

(57) ABSTRACT

An electrical interconnect includes an interconnect housing including a side and a face contiguous with the side, a plurality of electrical contacts each supported by the interconnect housing and including a first end and a second end, and an electrical circuit positioned adjacent the side of the interconnect housing, wherein the first end of each of the electrical contacts extends from the side of the interconnect housing and is electrically coupled to the electrical circuit, and the second end of each of the electrical contacts protrudes from the face of the interconnect housing and provides an electrical contact point.

41 Claims, 6 Drawing Sheets

US 6,736,488 B1

ELECTRICAL INTERCONNECT FOR PRINTHEAD ASSEMBLY

THE FIELD OF THE INVENTION

The present invention relates generally to inkjet printheads, and more particularly to an electrical interconnect for a printhead assembly.

BACKGROUND OF THE INVENTION

A conventional inkjet printing system, as one embodiment of a fluid ejection system, includes a printhead, an ink supply which supplies liquid ink to the printhead, and an electronic controller which controls the printhead. The printhead, as one embodiment of a fluid ejection device, ejects ink drops through a plurality of orifices or nozzles and toward a print medium, such as a sheet of paper, so as to print onto the print medium. Typically, the orifices are arranged in one or more arrays such that properly sequenced ejection of ink from the orifices causes characters or other images to be printed upon the print medium as the printhead and the print medium are moved relative to each other.

In one arrangement, commonly referred to as a wide-array inkjet printing system, a plurality of individual printheads, also referred to as printhead dies, are mounted on a single substrate or carrier. As such, a number of nozzles and, therefore, an overall number of ink drops which can be ejected per second is increased. Since the overall number of drops which can be ejected per second is increased, printing speed can be increased with the wide-array inkjet printing system. Mounting a plurality of printhead dies on a single carrier, however, requires communication of a plurality of power, ground, and data signals between the electronic controller and the printhead dies.

Accordingly, it is desirable for an electrical interconnect which facilitates communication of electrical signals between an electronic controller and a printhead assembly including a plurality of printhead dies mounted on a single carrier.

SUMMARY OF THE INVENTION

One aspect of the present invention provides an electrical interconnect. The electrical interconnect includes an interconnect housing including a side and a face contiguous with the side, a plurality of electrical contacts each supported by the interconnect housing and including a first end and a second end, and an electrical circuit positioned adjacent the side of the interconnect housing, wherein the first end of each of the electrical contacts extends from the side of the interconnect housing and is electrically coupled to the electrical circuit, and the second end of each of the electrical contacts protrudes from the face of the interconnect housing and provides an electrical contact point.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
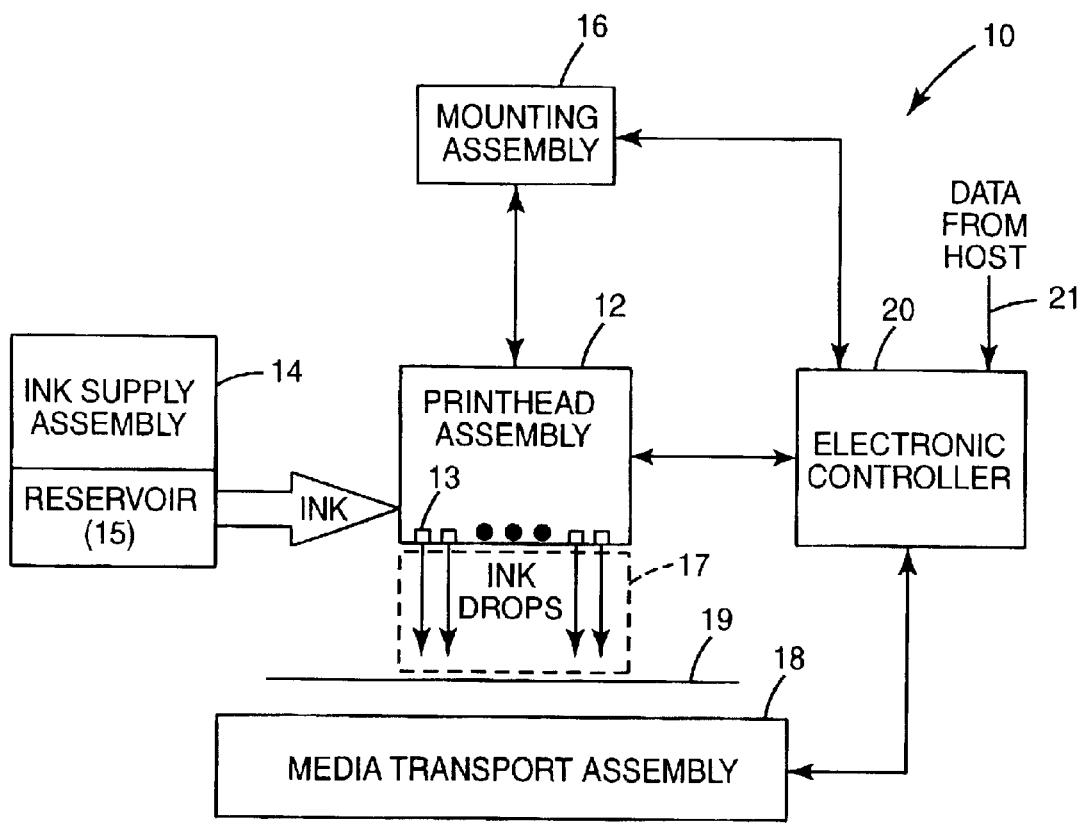
FIG. 1 is a block diagram illustrating one embodiment of an inkjet printing system.

FIG. 1 illustrates one embodiment of an inkjet printing system 10 according to the present invention. Inkjet printing system 10 constitutes one embodiment of a fluid ejection system which includes a fluid ejection assembly, such as an inkjet printhead assembly 12, and a fluid supply assembly, such as an ink supply assembly 14. In the illustrated embodiment, inkjet printing system 10 also includes a mounting assembly 16, a media transport assembly 18, and an electronic controller 20.

Inkjet printhead assembly 12, as one embodiment of a fluid ejection assembly, is formed according to an embodiment of the present invention, and includes one or more printheads or fluid ejection devices which eject drops of ink or fluid through a plurality of orifices or nozzles 13. In one embodiment, the drops are directed toward a medium, such as print medium 19, so as to print onto print medium 19. Print medium 19 is any type of suitable sheet material, such as paper, card stock, transparencies, Mylar, and the like. Typically, nozzles 13 are arranged in one or more columns or arrays such that properly sequenced ejection of ink from nozzles 13 causes, in one embodiment, characters, symbols, and/or other graphics or images to be printed upon print medium 19 as inkjet printhead assembly 12 and print medium 19 are moved relative to each other.

Ink supply assembly 14, as one embodiment of a fluid supply assembly, supplies ink to inkjet printhead assembly 12 and includes a reservoir 15 for storing ink. As such, in one embodiment, ink flows from reservoir 15 to inkjet printhead assembly 12. In one embodiment, inkjet printhead assembly 12 and ink supply assembly 14 are housed together in an inkjet or fluidjet cartridge or pen. In another embodiment, ink supply assembly 14 is separate from inkjet printhead assembly 12 and supplies ink to inkjet printhead assembly 12 through an interface connection, such as a supply tube.

Mounting assembly 16 positions inkjet printhead assembly 12 relative to media transport assembly 18 and media transport assembly 18 positions print medium 19 relative to inkjet printhead assembly 12. Thus, a print zone 17 is defined adjacent to nozzles 13 in an area between inkjet printhead assembly 12 and print medium 19. In one embodiment, inkjet printhead assembly 12 is a scanning type printhead assembly and mounting assembly 16 includes a carriage for moving inkjet printhead assembly 12 relative to media transport assembly 18. In another embodiment, inkjet printhead assembly 12 is a non-scanning type printhead assembly and mounting assembly 16 fixes inkjet printhead assembly 12 at a prescribed position relative to media transport assembly 18.

Electronic controller 20 communicates with inkjet printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical or other information transfer path. Data 21 represents, for example, a document and/or file to be printed. As such, data 21 forms a print job for inkjet printing system 10 and includes one or more print job commands and/or command parameters.

In one embodiment, electronic controller 20 provides control of inkjet printhead assembly 12 including timing control for ejection of ink drops from nozzles 13. As such, electronic controller 20 defines a pattern of ejected ink drops which form characters, symbols, and/or other graphics or images on print medium 19. Timing control and, therefore, the pattern of ejected ink drops is determined by the print job commands and/or command parameters. In one embodiment, logic and drive circuitry forming a portion of electronic controller 20 is located on inkjet printhead assembly 12. In another embodiment, logic and drive circuitry is located off inkjet printhead assembly 12.

Figure 2:
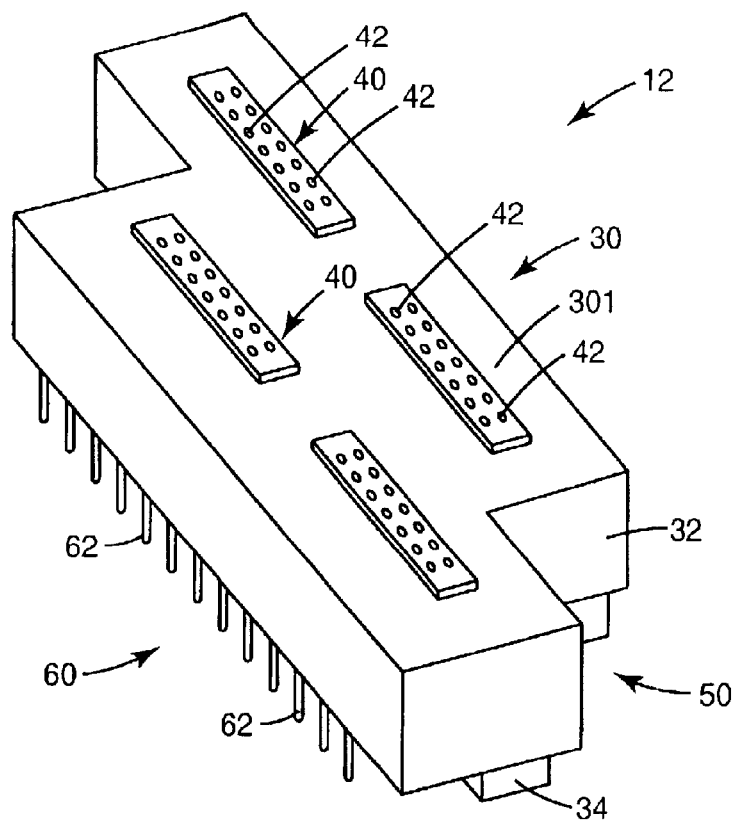
FIG. 2 is a top perspective view illustrating one embodiment of an inkjet printhead assembly.
Figure 3:
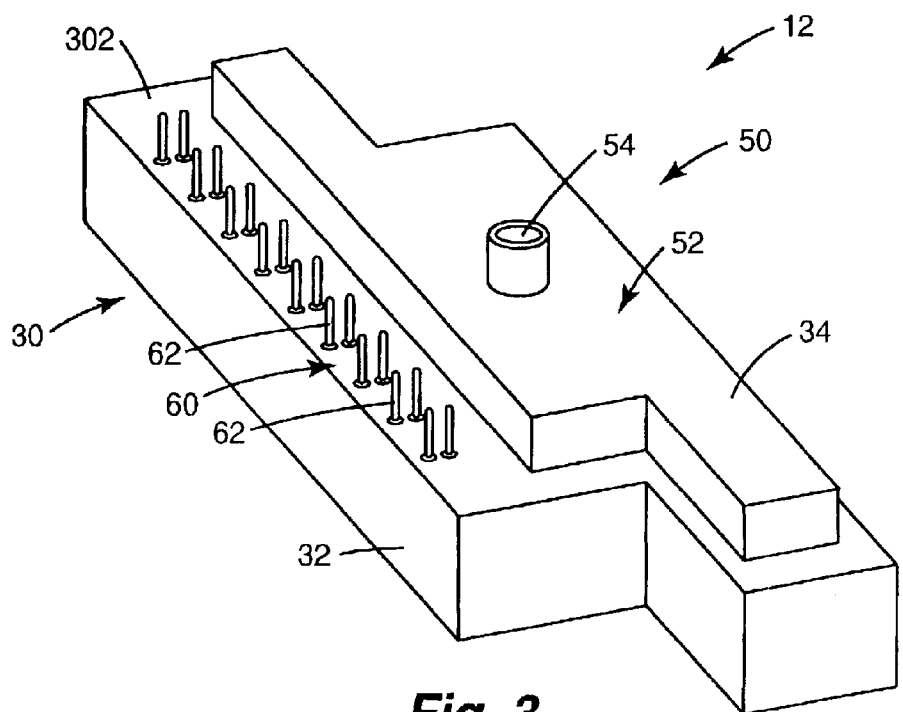
FIG. 3 is a bottom perspective view of the inkjet printhead assembly of FIG. 2.

FIGS. 2 and 3 illustrate one embodiment of a portion of inkjet printhead assembly 12. Inkjet printhead assembly 12 is a wide-array or multi-head printhead assembly and includes a carrier 30, a plurality of printhead dies 40, an ink delivery system 50, and an electronic interface system 60. Carrier 30 has an exposed surface or first face 301 and an exposed surface or second face 302 which is opposite of and oriented substantially parallel with first face 301. Carrier 30 serves to carry or provide mechanical support for printhead dies 40. In addition, carrier 30 accommodates fluidic communication between ink supply assembly 14 and printhead dies 40 via ink delivery system 50 and accommodates electrical communication between electronic controller 20 and printhead dies 40 via electronic interface system 60.

Printhead dies 40 are mounted on first face 301 of carrier 30 and aligned in one or more rows. In one embodiment, printhead dies 40 are spaced apart and staggered such that printhead dies 40 in one row overlap at least one printhead die 40 in another row. Thus, inkjet printhead assembly 12 may span a nominal page width or a width shorter or longer than nominal page width. While four printhead dies 40 are illustrated as being mounted on carrier 30, the number of printhead dies 40 mounted on carrier 30 may vary.

In one embodiment, a plurality of inkjet printhead assemblies 12 are mounted in an end-to-end manner. In another embodiment, a plurality of inkjet printhead assemblies 12 are mounted in a side-to-side manner. In one embodiment, to provide for at least one printhead die 40 of one inkjet printhead assembly 12 overlapping at least one printhead die 40 of an adjacent inkjet printhead assembly 12 when inkjet printhead assemblies 12 are mounted in an end-to-end manner, carrier 30 has a staggered or stair-step profile. While carrier 30 is illustrated as having a stair-step profile, it is within the scope of the present invention for carrier 30 to have other profiles including a substantially rectangular profile.

Ink delivery system 50 fluidically couples ink supply assembly 14 with printhead dies 40. In one embodiment, ink delivery system 50 includes a fluid manifold 52 and at least one port 54. Fluid manifold 52 is formed in carrier 30 and includes one or more chambers for distributing ink through carrier 30 to printhead dies 40. Port 54 communicates with fluid manifold 52 and provides an inlet for ink supplied by ink supply assembly 14.

Electronic interface system 60 electrically couples electronic controller 20 with printhead dies 40. In one embodiment, electronic interface system 60 includes a plurality of electrical contacts 62 which form input/output (I/O) contacts for electronic interface system 60. As such, electrical contacts 62 provide points for communicating electrical signals between electronic controller 20 and inkjet printhead assembly 12. Examples of electrical contacts 62 include I/O pins which engage corresponding I/O receptacles electrically coupled to electronic controller 20 and I/O contact pads or fingers which mechanically or inductively contact corresponding electrical nodes electrically coupled to electronic controller 20. Although electrical contacts 62 are illustrated as being provided on second face 302 of carrier 30, it is within the scope of the present invention for electrical contacts 62 to be provided on other sides of carrier 30.

Figure 4:
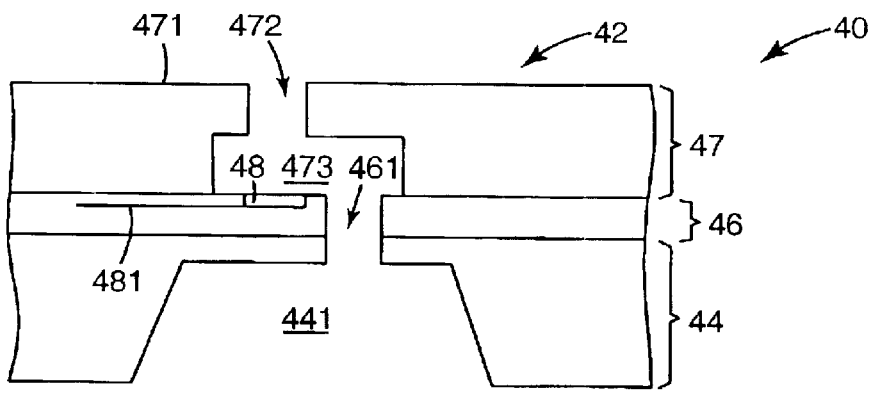
FIG. 4 is a schematic cross-sectional view illustrating portions of one embodiment of a printhead die.

As illustrated in the embodiment of FIGS. 2 and 4, each printhead die 40 includes an array of drop ejecting elements 42. Drop ejecting elements 42 are formed on a substrate 44 which has a fluid (or ink) feed slot 441 formed therein. As such, fluid feed slot 441 provides a supply of fluid (or ink) to drop ejecting elements 42. Substrate 44 is formed, for example, of silicon, glass, or a stable polymer.

In one embodiment, each drop ejecting element 42 includes a thin-film structure 46 with a firing resistor 48 and an orifice layer 47. Thin-film structure 46 has a fluid (or ink) feed channel 461 formed therein which communicates with fluid feed slot 441 of substrate 44. Orifice layer 47 has a front face 471 and a nozzle opening 472 formed in front face 471. Orifice layer 47 also has a nozzle chamber 473 formed therein which communicates with nozzle opening 472 and fluid feed channel 461 of thin-film structure 46. Firing resistor 48 is positioned within nozzle chamber 473 and includes leads 481 which electrically couple firing resistor 48 to a drive signal and ground.

Thin-film structure 46 is formed, for example, by one or more passivation or insulation layers of silicon dioxide, silicon carbide, silicon nitride, tantalum, poly-silicon glass, or other suitable material. In one embodiment, thin-film structure 46 also includes a conductive layer which defines firing resistor 48 and leads 481. The conductive layer is formed, for example, by aluminum, gold, tantalum, tantalum-aluminum, or other metal or metal alloy.

In one embodiment, during operation, fluid flows from fluid feed slot 441 to nozzle chamber 473 via fluid feed channel 461. Nozzle opening 472 is operatively associated with firing resistor 48 such that droplets of fluid are ejected from nozzle chamber 473 through nozzle opening 472 (e.g., normal to the plane of firing resistor 48) and toward a medium upon energization of firing resistor 48.

Example embodiments of printhead dies 40 include a thermal printhead, as previously described, a piezoelectric printhead, a flex-tensional printhead, or any other type of fluidjet ejection device known in the art. In one embodiment, printhead dies 40 are fully integrated thermal inkjet printheads.

Figure 5:
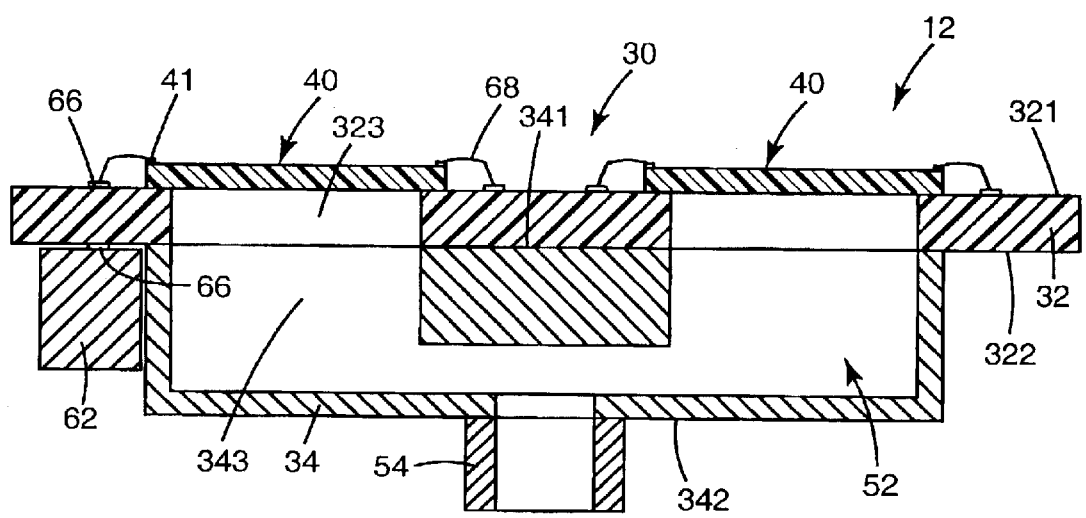
FIG. 5 is a schematic cross-sectional view illustrating one embodiment of an inkjet printhead assembly.

Referring to the embodiment of FIGS. 2, 3, and 5, carrier 30 includes a substrate 32 and a substructure 34. Substrate 32 and substructure 34 provide and/or accommodate mechanical, electrical, and fluidic functions of inkjet printhead assembly 12. More specifically, substrate 32 provides mechanical support for printhead dies 40, accommodates fluidic communication between ink supply assembly 14 and printhead dies 40 via ink delivery system 50, and provides electrical connection between and among printhead dies 40 and electronic controller 20 via electronic interface system 60. Substructure 34 provides mechanical support for substrate 32, accommodates fluidic communication between ink supply assembly 14 and printhead dies 40 via ink delivery system 50, and accommodates electrical connection between printhead dies 40 and electronic controller 20 via electronic interface system 60.

Substrate 32 has a first side 321 and a second side 322 which is opposite first side 321, and substructure 34 has a first side 341 and a second side 342 which is opposite first side 341. In one embodiment, printhead dies 40 are mounted on first side 321 of substrate 32 and substructure 34 is disposed on second side 322 of substrate 32. As such, first side 341 of substructure 34 contacts and is joined to second side 322 of substrate 32.

For transferring ink between ink supply assembly 14 and printhead dies 40, substrate 32 and substructure 34 each have a plurality of ink or fluid passages 323 and 343, respectively, formed therein. Fluid passages 323 extend through substrate 32 and provide a through-channel or through-opening for delivery of ink to printhead dies 40 and, more specifically, fluid feed slot 441 of substrate 44 (FIG. 4). Fluid passages 343 extend through substructure 34 and provide a through-channel or through-opening for delivery of ink to fluid passages 323 of substrate 32. As such, fluid passages 323 and 343 form a portion of ink delivery system 50. Although only one fluid passage 323 is shown for a given printhead die 40, there may be additional fluid passages to the same printhead die, for example, to provide ink of respective differing colors.

In one embodiment, substructure 34 is formed of a non-ceramic material such as plastic. It is, however, within the scope of the present invention for substructure 34 to be formed of silicon, stainless steel, or other suitable material or combination of materials. Preferably, substructure 34 is chemically compatible with liquid ink so as to accommodate fluidic routing.

Figure 6:
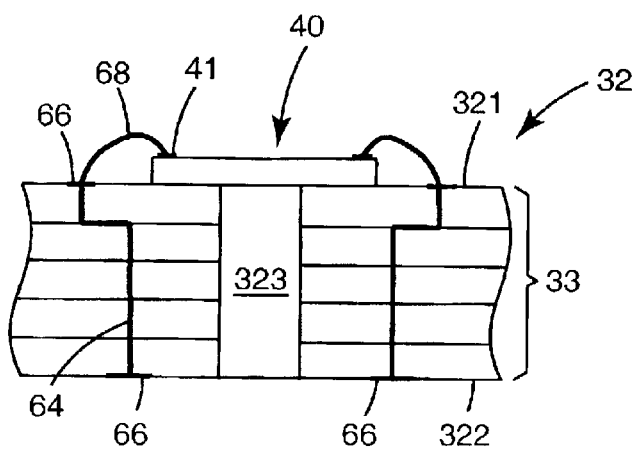
FIG. 6 is a schematic cross-sectional view illustrating one embodiment of a portion of a substrate for an inkjet printhead assembly.

In one embodiment, for transferring electrical signals between electronic controller 20 and printhead dies 40, electronic interface system 60 includes a plurality of conductive paths 64 extending through substrate 32, as illustrated in FIG. 6. More specifically, substrate 32 includes conductive paths 64 which: pass through and terminate at exposed surfaces of substrate 32. In one embodiment, conductive paths 64 include electrical contact pads 66 at terminal ends thereof which form, for example, I/O bond pads on substrate 32. Conductive paths 64, therefore, terminate at and provide electrical coupling between electrical contact pads 66.

Electrical contact pads 66 provide points for electrical connection to substrate 32 and, more specifically, conductive paths 64. Electrical connection is established, for example, via electrical connectors or contacts 62, such as I/O pins or spring fingers, wire bonds, electrical nodes, and/or other suitable electrical connectors. In one embodiment, printhead dies 40 include electrical contacts 41 which form I/O bond pads. As such, electronic interface system 60 includes electrical connectors, for example, wire bond leads 68, which electrically couple electrical contact pads 66 with electrical contacts 41 of printhead dies 40.

Conductive paths 64 transfer electrical signals between electronic controller 20 and printhead dies 40. More specifically, conductive paths 64 define transfer paths for power, ground, and data among and/or between printhead dies 40 and electrical controller 20. In one embodiment, data includes print data and non-print data.

In one embodiment, as illustrated in FIG. 6, substrate 32 includes a plurality of layers 33 each formed of a ceramic material. As such, substrate 32 includes circuit patterns which pierce layers 33 to form conductive paths 64. While substrate 32 is illustrated as including layers 33, it is, however, within the scope of the present invention for substrate 32 to be formed of a solid pressed ceramic material. As such, conductive paths are formed, for example, as thin-film metallized layers on the pressed ceramic material.

While conductive paths 64 are illustrated as terminating at first side 321 and second side 322 of substrate 32, it is, however, within the scope of the present invention for conductive paths 64 to terminate at other sides of substrate 32. In addition, one or more conductive paths 64 may branch from and/or lead to one or more other conductive paths 64. Furthermore, one or more conductive paths 64 may begin and/or end within substrate 32. Conductive paths 64 may be formed as described, for example, in U.S. Pat. No. 6,428,145, assigned to the assignee of the present invention and incorporated herein by reference.

It is to be understood that FIGS. 5 and 6 are simplified schematic illustrations of one embodiment of carrier 30, including substrate 32 and substructure 34. The illustrative routing of fluid passages 323 and 343 through substrate 32 and substructure 34, respectively, and conductive paths 64 through substrate 32, for example, has been simplified for clarity of the invention. Although various features of carrier 30, such as fluid passages 323 and 343 and conductive paths 64, are schematically illustrated as being straight, it is understood that design constraints could make the actual geometry more complicated for a commercial embodiment of inkjet printhead assembly 12. Fluid passages 323 and 343, for example, may have more complicated geometries to allow multiple colorants of ink to be channeled through carrier 30 to printhead dies 40. In addition, conductive paths 64 may have more complicated routing geometries through substrate 32 to avoid contact with fluid passages 323 and to allow for electrical connector geometries other than the illustrated I/O pins. It is understood that such alternatives are within the scope of the present invention.

Figure 7A:
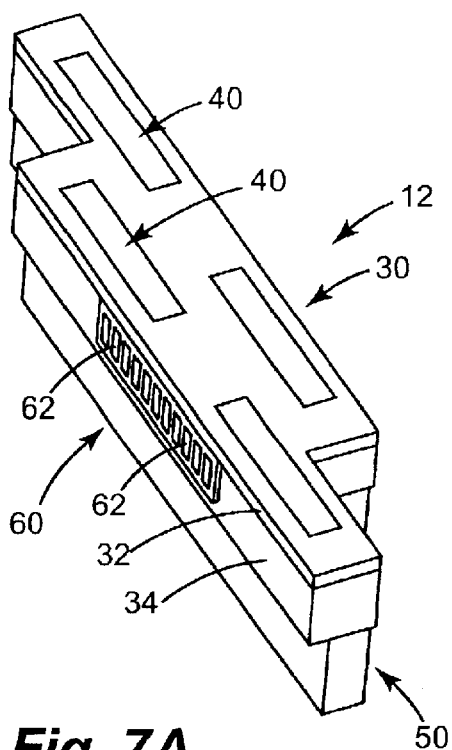
FIG. 7A is a top perspective view of one embodiment of an inkjet printhead assembly.
Figure 7B:
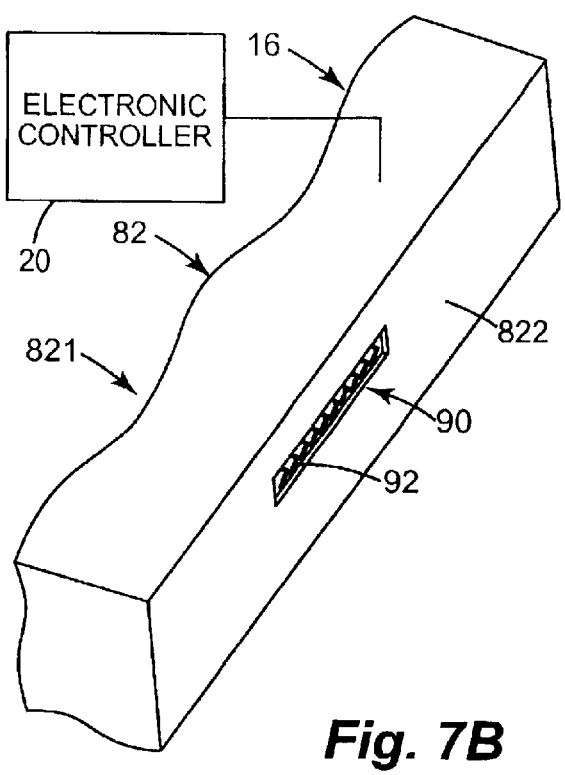
FIG. 7B is a top perspective view of a portion of one embodiment of a mounting assembly including one embodiment of an electrical interconnect.
Figure 7C:
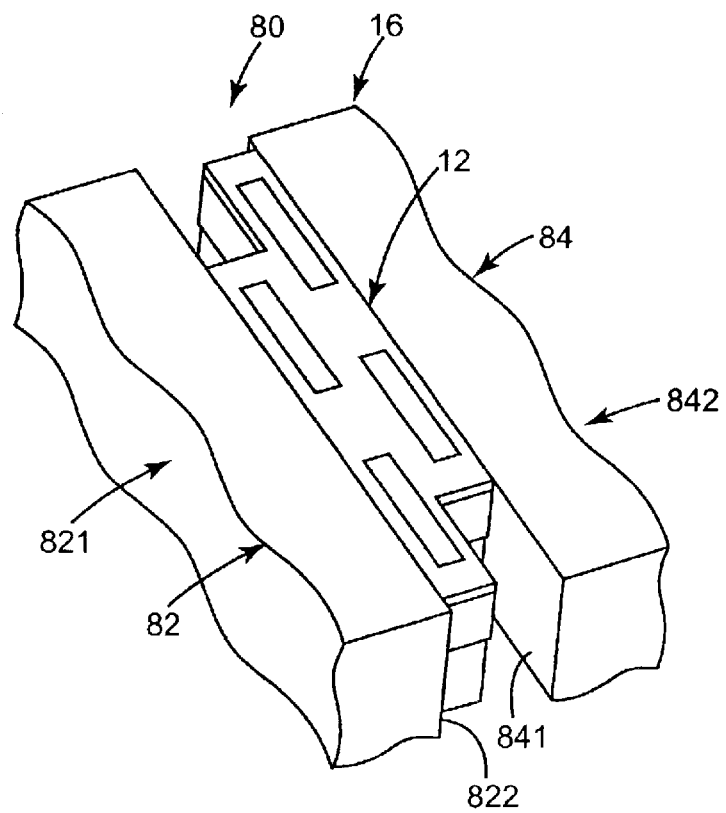
FIG. 7C is a top perspective view of the inkjet printhead assembly of FIG. 7A mounted in the mounting assembly of FIG. 7B.

FIGS. 7A, 7B, and 7C illustrate one embodiment of electrically coupling inkjet printhead assembly 12 with mounting assembly 16 and, therefore, electronic controller 20. As described above, inkjet printhead assembly 12 includes electronic interface 60. In addition, mounting assembly 16 includes a carriage 80 in which inkjet printhead assembly 12 is mounted and an electrical interconnect 90 with which electronic controller 20 communicates. As such, electrical interconnect 90 forms an input/output (I/O) interface for carriage 80. Thus, inkjet printhead assembly 12 communicates with electronic controller 20 via mounting assembly 16 and, more specifically, electronic interface 60 and electrical interconnect 90 when inkjet printhead assembly 12 is mounted in mounting assembly 16.

In one embodiment, carriage 80 includes a first carriage rail 82 and a second carriage rail 84. First carriage rail 82 and second carriage rail 84 each include a first side 821 and 841, respectively, and a second side 822 and 842, respectively. First side 821 and second side 822 of first carriage rail 82 are opposite each other, and first side 841 and second side 842 of second carriage rail 84 are opposite each other. First carriage rail 82 and second carriage rail 84 are opposed to and spaced from each other such that second side 822 of first carriage rail 82 faces first side 841 of second carriage rail 84. Inkjet printhead assembly 12 is mounted within carriage 80 such that carrier 30 is positioned between first carriage rail 82 and second carriage rail 84.

In the embodiment illustrated in FIG. 7A, electronic interface 60 of inkjet printhead assembly 12 includes a plurality of electrical contacts 62. Electrical contacts 62 are provided, for example, along opposite longitudinal sides of carrier 30 wherein first face 301 extends between the opposite longitudinal sides. Electrical contacts 62 are electrical coupled with printhead dies 40 via contact pads 66 and conductive paths 64 of substrate 32. (FIG. 6). As such, electrical contacts 62 form I/O contacts for inkjet printhead assembly 12 and provide points for communicating electrical signals with printhead dies 40. In one embodiment, electrical contacts 62 include contact pads. Forming of I/O contacts for inkjet printhead assembly 12 is described, for example, in U.S. Pat. No. 6,394,580, assigned to the assignee of the present invention and incorporated herein by reference.

In the embodiment illustrated in FIG. 7B, electrical interconnect 90 of mounting assembly 16 includes a plurality of electrical contacts 92. Electrical contacts 92 are electrically coupled with electronic controller 20 and provide points for communicating electrical signals between electronic controller 20 and inkjet printhead assembly 12. Electrical contacts 92 are provided, for example, along second side 822 of carriage rail 82 and first side 841 of second carriage rail 84. In one embodiment, as described below, electrical contacts 92 include resilient contact fingers.

In the embodiment illustrated in FIG. 7C, inkjet printhead assembly 12 is mounted between carriage rails 82 and 84 of carriage 80. As such, electrical contacts 62 of inkjet printhead assembly 12 contact electrical contacts 92 of carriage 80 when inkjet printhead assembly 12 is mounted in mounting assembly 16. Mounting of inkjet printhead assembly 12 in mounting assembly 16 is described, for example, in U.S. Pat. No. 6,350,013, assigned to the assignee of the present invention and incorporated herein by reference.

Figure 8:
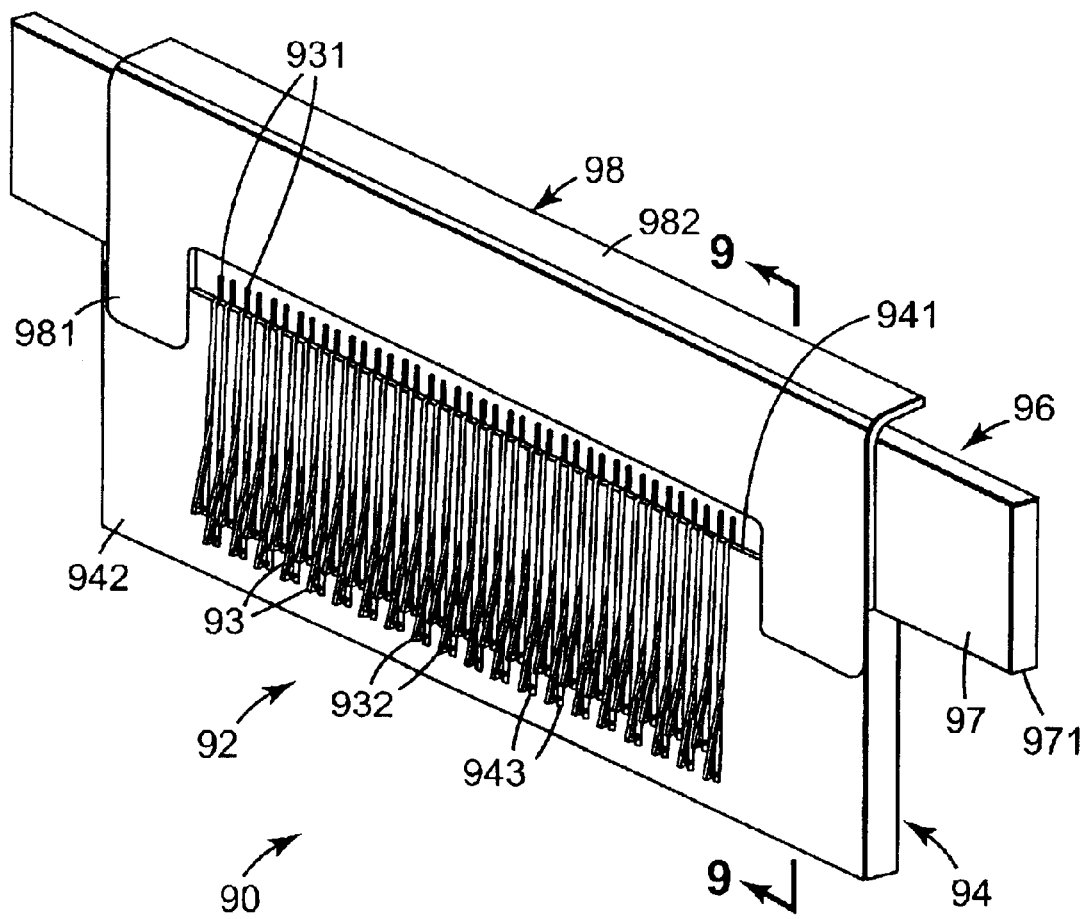
FIG. 8 is a top perspective view illustrating one embodiment of an electrical interconnect according to the present invention.
Figure 9:
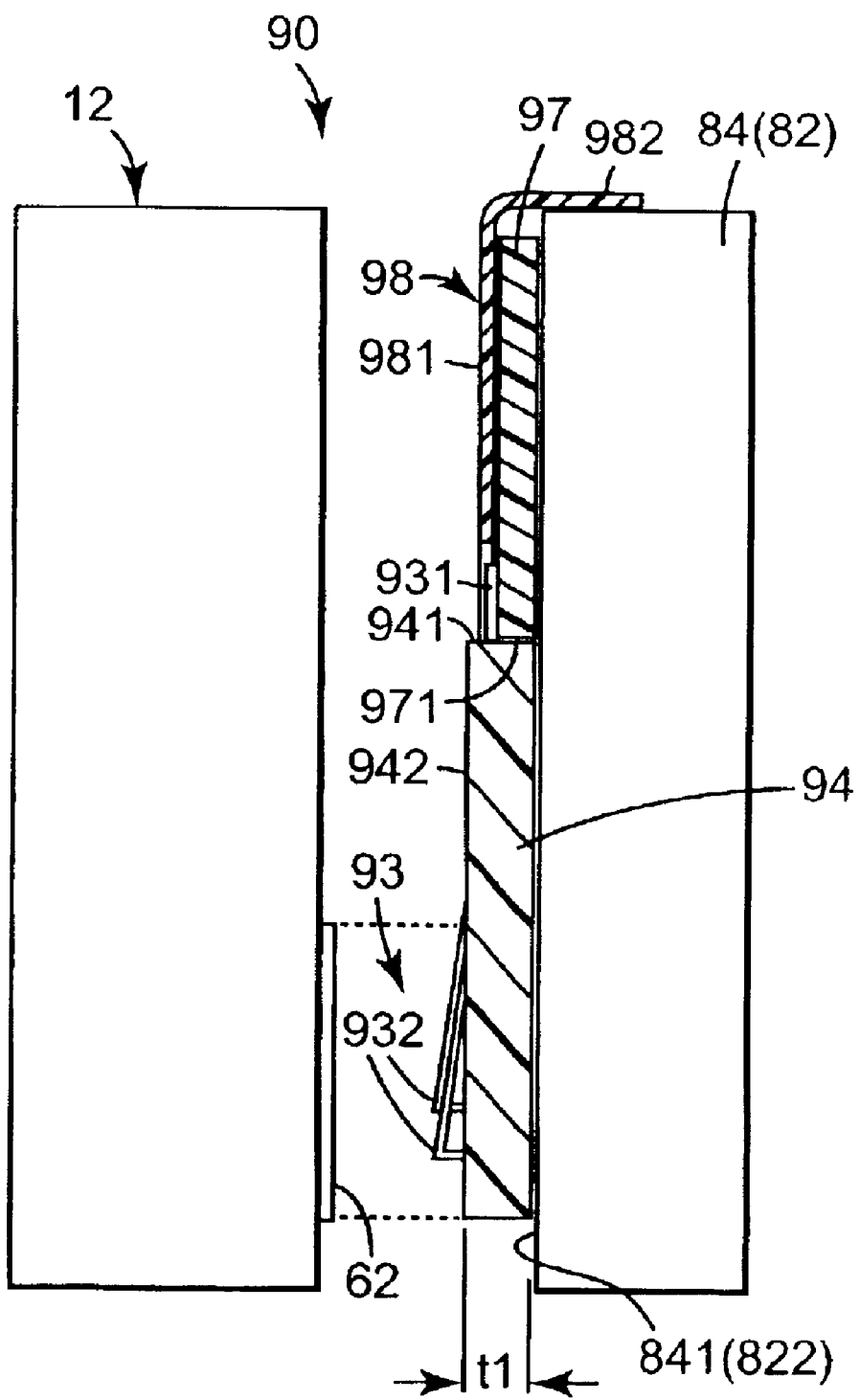
FIG. 9 is a schematic cross-sectional view from the perspective of line 9—9 of FIG. 8 illustrating one embodiment of electrical interconnection between an inkjet printhead assembly and a mounting assembly including the electrical interconnect of FIG. 8.

FIGS. 8 and 9 illustrate one embodiment of electrical interconnect 90. Electrical interconnect 90 includes electrical contacts 92, an interconnect housing 94, and an electrical circuit 96. Interconnect housing 94 accommodates and supports electrical contacts 92, and electrical circuit 96 facilitates communication of electrical signals between electronic controller 20 and electrical contacts 92. In addition, interconnect housing 94 supports electrical circuit 96, as described below.

In one embodiment, electrical contacts 92 include flexible or resilient contact fingers 93. Each contact finger 93 includes a first end 931 and a second end 932 with first end 931 of each contact finger 93 being electrically coupled to electrical circuit 96 and second end 932 of each contact finger 93 providing an electrical contact point, as described below. In one embodiment, electrical contacts 92 form two rows of electrical contacts for electrical interconnect 90. It is, however, within the scope of the present invention for electrical contacts 92 to form any number of rows of electrical contacts for electrical interconnect 90, including one row of electrical contacts.

In one embodiment, interconnect housing 94 has a side 941 and a face 942. Face 942 is contiguous with side 941 and, in one embodiment, side 941 and face 942 are oriented substantially perpendicular to each other. In one embodiment, electrical contacts 92 are supported by interconnect housing 94 such that first end 931 of each contact finger 93 extends from side 941 of interconnect housing 94. Preferably, electrical circuit 96 is positioned adjacent side 941 of interconnect housing 94. As such, first end 931 of each contact finger 93 can be electrically coupled to electrical circuit 96, as described below. In addition, in one embodiment, second end 932 of each contact finger 93 protrudes from face 942 of interconnect housing 94. Thus, second end 932 of each contact finger 93 can provide an electrical contact point for electrical interconnect 90.

In one embodiment, interconnect housing 94 includes a plurality of slots 943. Slots 943 are formed in face 942 of interconnect housing 94 and, in one embodiment, extend to side 941 of interconnect housing 94. Each slot 943 accommodates at least one contact finger 93 and permits the respective contact finger 93 to flex relative to interconnect housing 94. More specifically, slots 943 accommodate contact fingers 93 such that second ends 932 of contact fingers 93 can be biased into slots 943 when inkjet printhead assembly 12 is mounted in mounting assembly 16, as described above.

In one embodiment, electrical circuit 96 includes a printed circuit board 97. Printed circuit board 97 is electrically coupled with electronic controller 20 and provides points for electrical connection of electrical contacts 92. More specifically, printed circuit board 97 includes contacts to which first ends 931 of contact fingers 93 are electrically coupled. In one embodiment, for example, first ends 931 of contact fingers 93 are soldered to contacts (not shown) of printed circuit board 97.

In one embodiment, as illustrated in FIG. 9, printed circuit board 97 has a side 971. Printed circuit board 97 is positioned adjacent interconnect housing 94 such that side 971 of printed circuit board 97 is positioned along side 941 of interconnect housing 94. In one embodiment, side 941 of interconnect housing 94 has a thickness t1. Preferably, printed circuit board 97 is positioned adjacent interconnect housing 94 so as to be positioned within thickness t1 of interconnect housing 94. As such, an overall thickness of electrical interconnect 90 is minimized.

In one embodiment, as illustrated in FIGS. 8 and 9, electrical interconnect 90 includes a support or flange 98. Flange 98 extends from interconnect housing 94 and between opposite ends of interconnect housing 94 along side 941. In one embodiment, flange 98 extends from side 941 of interconnect housing 94. In one embodiment, flange 98 has an L-shaped cross-section and includes a first portion 981 secured or coupled to interconnect housing 94 and a second portion 982 which facilitates mounting of electrical interconnect 90 on carriage rail 82 or 84.

In one embodiment, interconnect housing 94 is formed of a plastic material and flange 98 is formed of metal. As such, flange 98 strengthens or stiffens interconnect housing 94 and reduces bowing of interconnect housing 94. In addition, in one embodiment, electrical circuit 96 and, more specifically, printed circuit board 97 is supported by interconnect housing 94 and secured to flange 98. As such, flange 98 also reduces bowing of printed circuit board 97. In one embodiment, flange 98 is formed separately from and secured or coupled to interconnect housing 94. In another embodiment, flange 98 is formed integrally with interconnect housing 94.

As illustrated in the embodiment of FIG. 9, electrical interconnect 90 is mounted on carriage rail 84 (or carriage rail 82) and positioned along side 841 (or side 822) of carriage rail 84 (or carriage rail 82). By positioning electrical circuit 96 and, more specifically, printed circuit board 97 within thickness t1 of interconnect housing 94, an overall thickness of electrical interconnect 90 can be minimized. Thus, a distance between carriage rail 84 (or carriage rail 82) and inkjet printhead assembly 12 can be minimized when inkjet printhead assembly 12 is mounted between carriage rails 84 and 82 of carriage 80.

In one embodiment, when inkjet printhead assembly 12 is a scanning type printhead assembly and carriage 80 traverses the print medium during printing, carriage 80 may travel a distance beyond the edges of the print medium so that inkjet printhead assembly 12 can print closer to the edges of the print medium. This distance which carriage 80 travels beyond the edges of the print medium, commonly referred to as overtravel, impacts throughput of the printing system since traveling this additional distance uses additional printing time. By minimizing a distance between carriage rail 84 (or carriage rail 82) and inkjet printhead assembly 12, however, the amount of overtravel is also minimized since inkjet printhead assembly 12 can be moved closer to the edges of the print medium without additional movement of carriage 80 beyond the edges of the print medium. Thus, printing time can be reduced and throughput of the printing system may be increased.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An electrical interconnect, comprising:
   an interconnect housing including a side and a face contiguous with the side;
   a plurality of electrical contacts each supported by the interconnect housing and including a first end and a second end; and
   an electrical circuit positioned adjacent the side of the interconnect housing,
   wherein the first end of each of the electrical contacts extends from the side of the interconnect housing and is electrically coupled to the electrical circuit, and the second end of each of the electrical contacts protrudes from the face of the interconnect housing and provides an electrical contact point.

2. The electrical interconnect of claim 1, wherein the side and the face of the interconnect housing are substantially perpendicular to each other.

3. The electrical interconnect of claim 1, wherein the electrical circuit is supported by the interconnect housing.

4. The electrical interconnect of claim 1, wherein the electrical circuit includes a printed circuit board.

5. The electrical interconnect of claim 4, wherein the printed circuit board has a side positioned along the side of the interconnect housing.

6. The electrical interconnect of claim 4, wherein the interconnect housing has a thickness, and the printed circuit board is positioned within the thickness of the interconnect housing.

7. The electrical interconnect of claim 1, wherein the plurality of electrical contacts form two rows of electrical contact points.

8. The electrical interconnect of claim 1, wherein the plurality of electrical contacts includes a plurality of resilient contact fingers each adapted to flex relative to the interconnect housing.

9. The electrical interconnect of claim 8, wherein the interconnect housing includes a plurality of slots each accommodating at least one of the resilient contact fingers.

10. The electrical interconnect of claim 1, further comprising:
    a flange extended from and between opposite ends of the interconnect housing.

11. The electrical interconnect of claim 10, wherein the flange is adapted to facilitate mounting of the electrical interconnect.

12. A mounting assembly for a printhead assembly, the mounting assembly comprising:
    a first carriage rail;
    a second carriage rail opposed to and spaced from the first carriage rail; and
    an electrical interconnect provided on at least one of the first carriage rail and the second carriage rail,
    wherein the electrical interconnect includes an interconnect housing, an electrical circuit positioned adjacent the interconnect housing, and a plurality of electrical contacts each supported by the interconnect housing and having a first end electrically coupled to the electrical circuit and a second end providing an electrical contact point.

13. The mounting assembly of claim 12, wherein the interconnect housing of the electrical interconnect includes a side and a face contiguous with the side, wherein the electrical circuit of the electrical interconnect is positioned adjacent the side of the interconnect housing, and wherein the first end of each of the electrical contacts extends from the side of the interconnect housing and the second end of each of the electrical contacts protrudes from the face of the interconnect housing.

14. The mounting assembly of claim 13, wherein the side and the face of the interconnect housing are substantially perpendicular to each other.

15. The mounting assembly of claim 12, wherein the electrical circuit of the electrical interconnect is supported by the interconnect housing of the electrical interconnect.

16. The mounting assembly of claim 12, wherein the electrical circuit of the electrical interconnect includes a printed circuit board.

17. The mounting assembly of claim 16, wherein the printed circuit board has a side positioned along a side of the interconnect housing.

18. The mounting assembly of claim 16, wherein the interconnect housing of the electrical interconnect has a thickness, and the printed circuit board is positioned within the thickness of the interconnect housing.

19. The mounting assembly of claim 12, wherein the plurality of electrical contacts of the electrical interconnect form two rows of electrical contact points.

20. The mounting assembly of claim 12, wherein the plurality of electrical contacts of the electrical interconnect includes a plurality of resilient contact fingers each adapted to flex relative to the interconnect housing.

21. The mounting assembly of claim 20, wherein the interconnect housing of the electrical interconnect includes a plurality of slots each accommodating at least one of the resilient contact fingers.

22. The mounting assembly of claim 12, wherein the electrical interconnect further includes a flange extended from and between opposite ends of the interconnect housing of the electrical interconnect.

23. The mounting assembly of claim 22, wherein the electrical interconnect is secured to the at least one of the first carriage rail and the second carriage rail by the flange.

24. The mounting assembly of claim 12, wherein the printhead assembly includes a plurality of printhead dies and a plurality of electrical contacts electrically coupled with the printhead dies, wherein the mounting assembly is adapted to support the printhead assembly and the electrical contacts of the printhead assembly are adapted to contact the electrical contacts of the mounting assembly when the printhead assembly is mounted in the mounting assembly.

25. An assembly, comprising:
a mounting assembly including an electrical interconnect; and
a printhead assembly including a plurality of printhead dies and a first plurality of electrical contacts electrically coupled with the printhead dies,
wherein the electrical interconnect of the mounting assembly includes an interconnect housing, an electrical circuit positioned adjacent the interconnect housing, and a second plurality of electrical contacts each supported by the interconnect housing and having a first end electrically coupled to the electrical circuit and a second end providing an electrical contact point, and wherein the first plurality of electrical contacts are adapted to contact the second plurality of electrical contacts when the printhead assembly is mounted in the mounting assembly.

26. The assembly of claim 25, wherein the interconnect housing of the electrical interconnect includes a side and a face contiguous with the side, wherein the electrical circuit of the electrical interconnect is positioned adjacent the side of the interconnect housing, and wherein the first end of each of the second plurality of electrical contacts extends from the side of the interconnect housing and the second end of each of the second plurality of electrical contacts protrudes from the face of the interconnect housing.

27. The assembly of claim 26, wherein the side and the face of the interconnect housing are substantially perpendicular to each other.

28. The assembly of claim 25, wherein the electrical circuit of the electrical interconnect is supported by the interconnect housing of the electrical interconnect.

29. The assembly of claim 25, wherein the electrical circuit of the electrical interconnect includes a printed circuit board.

30. The assembly of claim 29, wherein the printed circuit board has a side positioned along a side of the interconnect housing.

31. The assembly of claim 29, wherein the interconnect housing of the electrical interconnect has a thickness, and the printed circuit board is positioned within the thickness of the interconnect housing.

32. The assembly of claim 25, wherein the second plurality of electrical contacts of the electrical interconnect form two rows of electrical contact points.

33. The assembly of claim 25, wherein the second plurality of electrical contacts of the electrical interconnect includes a plurality of resilient contact fingers each adapted to flex relative to the interconnect housing of the electrical interconnect.

34. The assembly of claim 33, wherein the interconnect housing of the electrical interconnect includes a plurality of slots each accommodating at least one of the resilient contact fingers.

35. The assembly of claim 25, wherein the electrical interconnect of the mounting assembly further includes a flange extended from and between opposite ends of the interconnect housing.

36. The assembly of claim 35, wherein the mounting assembly includes at least one carriage rail, and wherein the electrical interconnect is secured to the at least one carriage rail by the flange.

37. An assembly, comprising:
a mounting assembly;
a printhead assembly mounted in the mounting assembly and including a plurality of printhead dies, the printhead dies adapted to print on a print medium and the printhead assembly adapted to traverse the print medium during printing; and
means for electrically coupling the printhead dies of the printhead assembly with the mounting assembly, including means for minimizing overtravel beyond an edge of the print medium during printing.

38. The assembly of claim 37, wherein means for electrically coupling the printhead dies includes a first plurality of electrical contacts and an electrical interconnect including a housing, an electrical circuit positioned adjacent the housing, and a second plurality of electrical contacts each supported by the housing and having a first end electrically coupled to the electrical circuit and a second end providing an electrical contact point.

39. The assembly of claim 38, wherein means for minimizing overtravel includes means for minimizing a distance between the mounting assembly and the printhead assembly when the printhead assembly is mounted in the mounting assembly.

40. The assembly of claim 39, wherein means for minimizing the distance between the mounting assembly and the printhead assembly includes the electrical circuit of the electrical interconnect positioned within a thickness of the housing of the electrical interconnect.

41. The assembly of claim 38, wherein the first plurality of electrical contacts are electrically coupled with the printhead dies and the electrical interconnect is supported by the mounting assembly.

* * * * *